United States Patent [19]

Koker

[11] Patent Number: 5,120,990
[45] Date of Patent: Jun. 9, 1992

[54] APPARATUS FOR GENERATING MULTIPLE PHASE CLOCK SIGNALS AND PHASE DETECTOR THEREFOR

[75] Inventor: Gregory T. Koker, Stoughton, Mass.

[73] Assignee: Analog Devices, Inc., Norwood, Mass.

[21] Appl. No.: 545,887

[22] Filed: Jun. 29, 1990

[51] Int. Cl.⁵ .......................................... H03K 5/159
[52] U.S. Cl. ................................. 307/269; 307/511; 307/606; 328/133; 328/155
[58] Field of Search ............... 307/269, 511, 602, 603, 307/606; 328/133, 155, 55

[56] References Cited

U.S. PATENT DOCUMENTS

| | | | |
|---|---|---|---|
| 3,870,962 | 3/1975 | D'Errico | 307/269 |
| 3,883,687 | 5/1975 | Stenstrom | 307/269 |
| 4,484,142 | 11/1984 | Rub et al. | 307/511 |
| 4,506,231 | 3/1985 | Green, Jr. et al. | 307/511 |
| 4,700,084 | 10/1987 | Honaker, Jr. | 307/511 |
| 4,760,280 | 7/1988 | Schwefel et al. | 307/269 |
| 4,797,572 | 1/1989 | Metz | 307/269 |
| 4,827,157 | 5/1989 | Machida et al. | 307/269 |
| 4,855,615 | 8/1989 | Humpleman | 307/260 |
| 4,868,430 | 9/1989 | Stewart | 307/269 |
| 4,873,491 | 10/1989 | Wilkens | 307/511 |
| 4,922,141 | 5/1990 | Lofgren et al. | 328/55 |
| 4,975,660 | 12/1990 | Svenson | 328/133 |

OTHER PUBLICATIONS

Bazes, M., "A novel Precision MOS Synchronous Delay Line" in *IEEE Journal of Solid-State Circuits*, vol. SC-20, No. 6, Dec. 1985, pp. 1265-1271.

Johnson, M. G. and Hudson, E. L., "A Variable Delay Line PLL for CPU-Coprocessor Synchronization" in *IEEE Journal of Solid-State Circuits*, vol. 23, No. 5, Oct. 1988, pp. 1218-1223.

*Primary Examiner*—Stanley D. Miller
*Assistant Examiner*—Terry D. Cunningham
*Attorney, Agent, or Firm*—Wolf, Greenfield & Sacks

[57] ABSTRACT

A phase detector circuit is provided for correction of operation of a synchronous delay line clock generator. The phase detector includes multiple edge detectors. The multiple edge detectors provide an override of any corrective action by the rest of the phase detector to the synchronous delay line output, notwithstanding presence or absence of any phase error of less than 360°, if the phase position of the delay line output signal is off by an integral multiple of 360°. Multiple taps from daisy-chained or series-connected delay line elements are provided to the multiple edge detectors. The multiple edge detectors compare the edge produced by each such tap against (in the first instance) one division of divided clock signal or (for each subsequent tap) the result of the previous such comparison. In each such case, the comparison is accomplished by a not R, not S flip-flop receiving the signals to be compared. Although only two delay line elements need to be so tapped, tapping three or more such delay line elements ensures greater accuracy over a higher odd integral multiple of the clock signal. Also, even (as opposed to odd) integral multiples of the period of the clock signal are addressed by the part of the phase detector not including the edge detectors, since the phase detector receives only one of the divided clock signals. Faster correction of phase and frequency errors can be accomplished with an additional such phase detector that would be connected to the other division of the divided clock signal. This additional such phase detector would also include multiple edge detectors together receiving multiple taps from the delay line.

14 Claims, 10 Drawing Sheets

APPARATUS FOR GENERATING MULTIPLE PHASE CLOCK SIGNALS AND PHASE DETECTOR THEREFOR

FIELD OF THE INVENTION

The present invention relates to apparatus for generating multiple phase clock signals and to phase detectors, and more particularly to a phase detector for correcting the phase of one or more clock signals produced by a synchronous delay line or similar device.

BACKGROUND OF THE INVENTION

There exist applications in which there is a need to generate multiple internal clock phases or sub-phases from a signal input clock, all of which are synchronized together, wherein the generated clock signals are corrected for phase and frequency errors, particularly phase errors of integral multiples of 360°. The present invention fulfills that need.

It has been a general practice to employ MOS synchronous delay lines to provide additional timing edges from a reference clock signal. Although such devices have served the purpose, they have not proven entirely satisfactory under all conditions of service because, particularly with large frequency range requirements, there is a need to correct the outputs of such dealy lines for phase not only within a range of 0°-360°, but also to correct phase errors which are integral multiples of 360°. Such correction is needed so that the outputs remain relatively in phase with each other. This problem is overcome by the present invention.

One such synchronous delay line is described in Bazes, M., "A Novel Precision MOS Synchronous Delay Line" in *IEEE Journal of Solid-State Circuits*, Vol. SC-20, No. 6, December 1985, pp. 1265-1271, which is hereby incorporated by reference. An integrated phase-locked loop including phase detection is described in Johnson, M. G. and Hudson, E. L., "A Variable Delay Line PLL for CPU-Coprocesser Synchronization" in *IEEE Journal of Solid-State Circuits*, Vol. 23, No. 5, October 1988, pp. 1218-1223, which is also hereby incorporated by reference. However, the delay lines, and the phase detectors of Johnson and Hudson, and of Bazes, can be operated over only a limited frequency range, and are subject to start-up or fractional frequency lock-up problems, since a known precision clock input is required. If the user needs more flexible clocking requirements, then problems can occur. In Bazes and especially in Johnson and Hudson, the clock waveform input is very controlled and limited to a very small frequency variation. If the user, erroneously or otherwise, would alter the clock frequency in the middle of a cycle, or power the system up and down, then the system of Bazes, and the system of Johnson and Hudson, would likely not operate properly.

SUMMARY OF THE INVENTION

Accordingly, an object of the present invention is to provide apparatus for generating a plurality of differently phased periodic signals that are corrected to have predetermined desired phase relationship.

Another object of the present invention to provide a phase detector capable of detecting phase errors, in a periodic signal, of integral multiples of 360°, as well as phase errors of less than 360°, when compared with another periodic signal.

A further object of the present invention is the provision of apparatus that can be used to generate multiple internal clock phases or sub-phases from a single input clock, all of which are synchronized together, wherein the generated clock signals are corrected for phase and frequency errors, particularly phase errors of integral multiples of 360°.

A still further object of the present invention is to provide apparatus, receiving a clock signal, which apparatus is capable of producing a plurality of phases of that clock signal as output clock signals.

Briefly, these and other objects of the present invention are accomplished by an analog, tapped voltage-controlled delay line, having a feedback loop around it to match its overall delay to an incoming clock, and utilizing multiple delay elements or stages to produce at the taps multiple phases of the original clock signal. To avoid phase errors in the output signal, a phase detector is utilized to compare each of these multiple output signals with the original clock signal or a divided form of the original clock signal. Phase errors of integral multiples of 360° are detected by a plurality of edge detectors connected in series. The phase detector thereby detects not only phase errors of less than 360°, but also phase errors of integral multiples of 360°. If the latter such errors are not corrected, then incorrect sequencing of output pulses could result, causing erroneous operation of a device utilizing those pulses. The phase detector is used to determine whether the control voltage of the delay line should be changed because of the detection of a phase error. The phase detector is connected to receive a plurality of taps from the delay line, each such tap being drawn from one of the multiple elements of the delay line. Changing the control voltage correspondingly increases or decreases the propagation delay through the delay line, to adjust for any detected phase error.

Other objects, advantages and novel features of the invention will become apparent from the following detailed description of the invention when considered in conjunction with the accompanying drawings.

DETAILED DESCRIPTION

Figure 1:
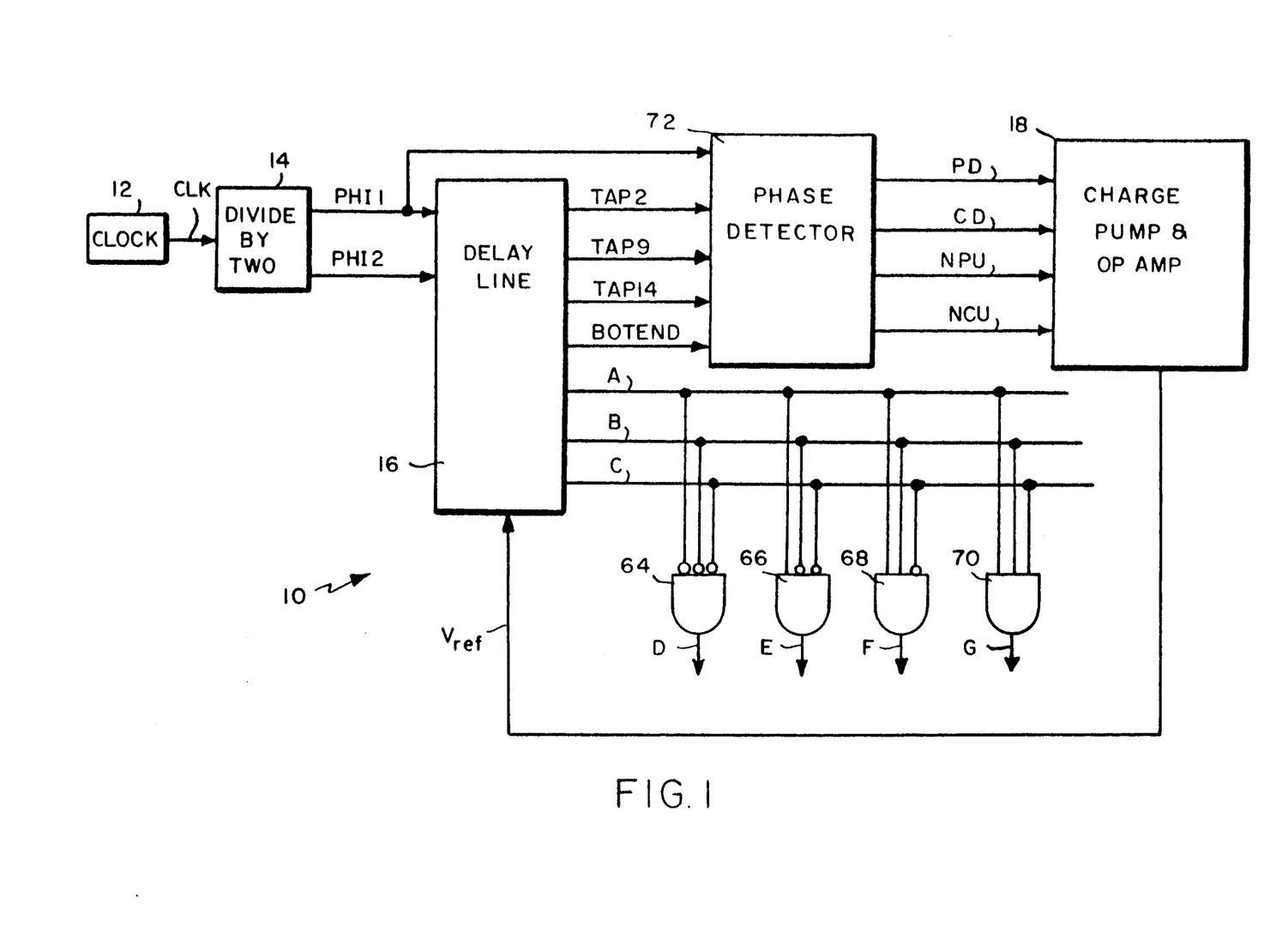
FIG. 1 is a block diagram of one embodiment of a feedback controlled synchronous delay line according to the present invention.
Figure 2:
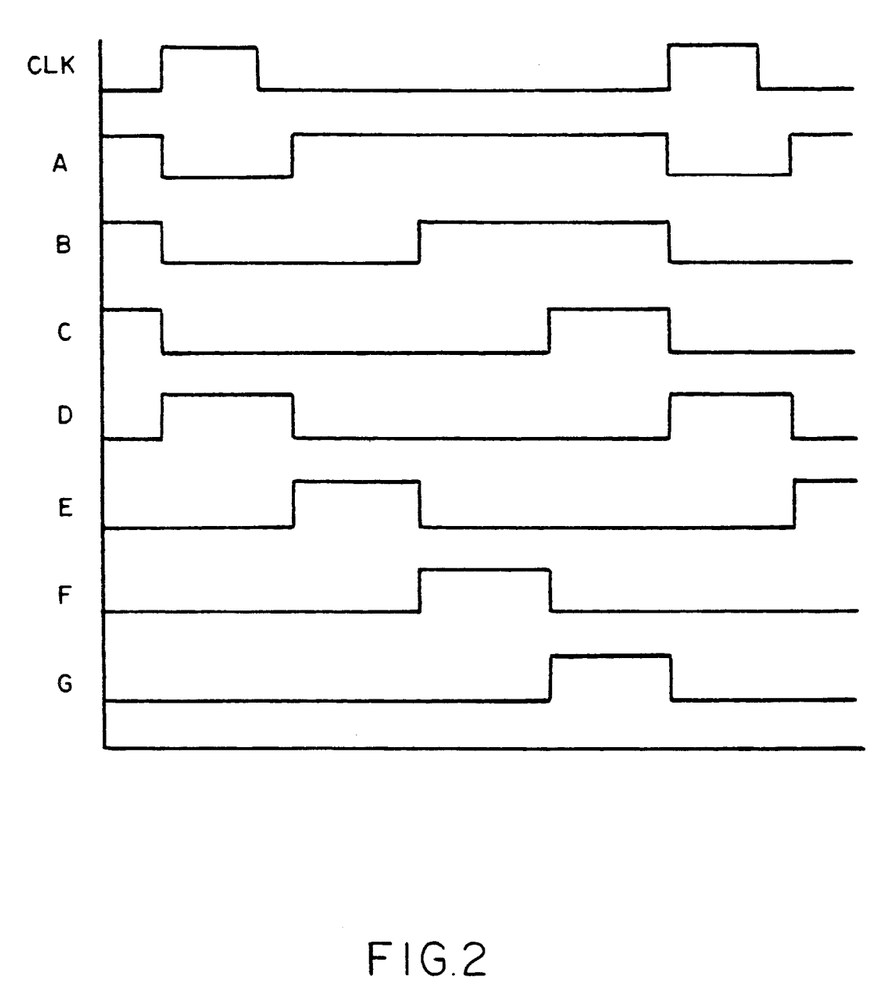
FIG. 2 is a waveform timing diagram for signals that can be received, signals that can be within, and signals that can be produced by the apparatus of FIG. 1.

Referring now to the drawings, wherein like reference characters designate like or corresponding parts throughout the several views, there is shown in FIG. 1 a synchronous delay line 10 utilized as an analog clock signal generator, and receiving a clock signal input CLK from clock 12. Clock signal CLK, shown in FIG. 2, is provided to divide-by-two component 14. Divide-by-two 14 produces two divided clock signals PHI1 and PHI2, each of which is provided to an input of segmented delay line 16. Signals PHI1 and PHI2 are 180° out of phase with each other. Delay line 16 is controlled by reference voltage $V_{ref}$ which is produced by charge pump 18 as a feedback control signal, as described below.

Figure 3:
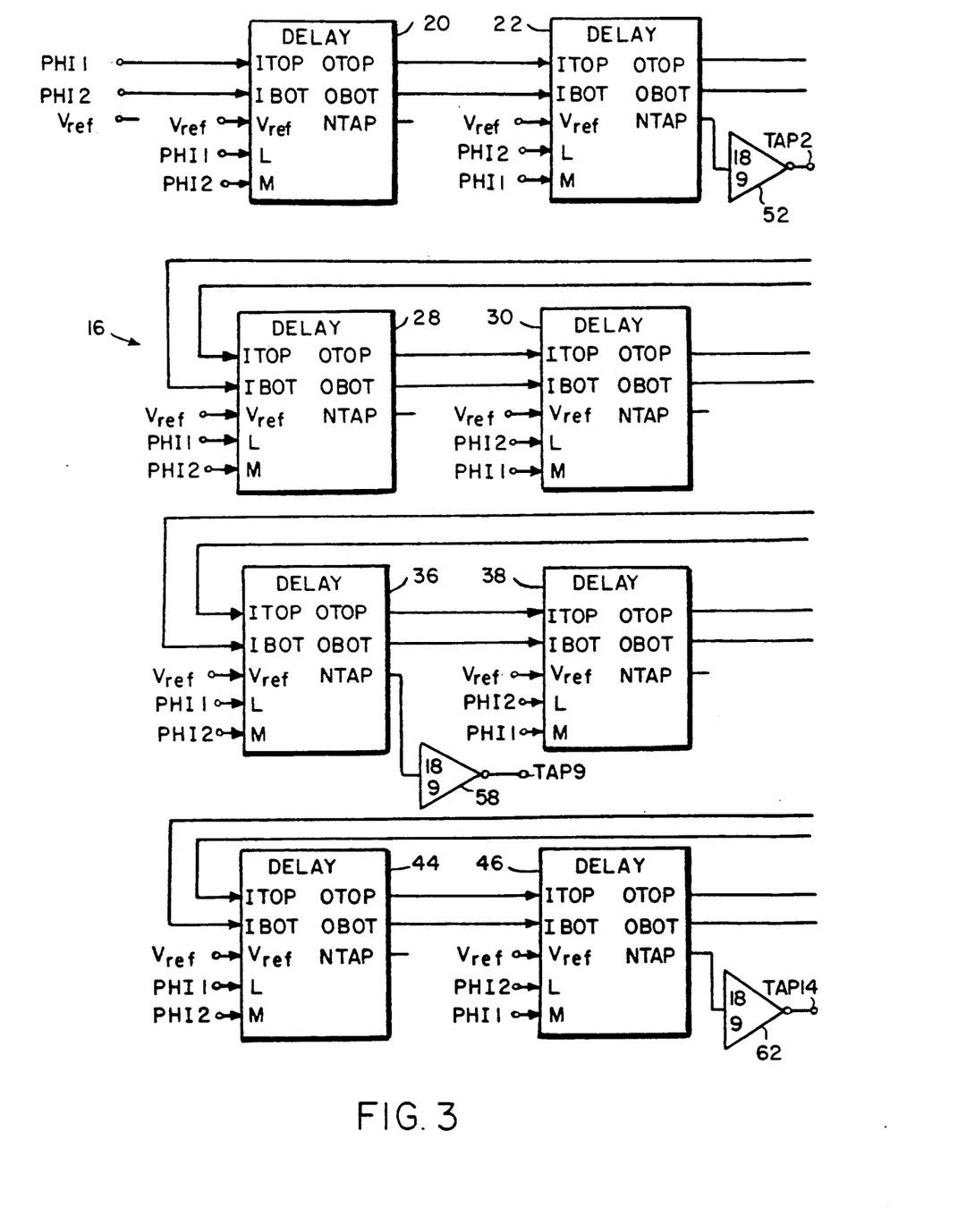
FIG. 3 is a block diagram of a multiple segment delay line that can be utilized in the apparatus of FIG. 1.

As shown in FIG. 3, delay line 16 includes a plurality of delay line segments 20-50. Each such delay segment has a top signal input ITOP, a top signal output OTOP, a bottom signal input IBOT, a bottom signal output OBOT, and an inverted tap signal output NTAP. Signals PHI1 and PHI2 are applied to inputs L and M (or M and L) of each delay segment, to select which output signal OTOP or OBOT is to be utilized to produce the tap signal at output NTAP. Each such delay segment produces a delay on signals received at the ITOP and IBOT inputs, which delayed signals are respectively produced at the OTOP and OBOT outputs. The value of this delay is controlled by the $V_{ref}$ input of the delay segment.

Figure 4:
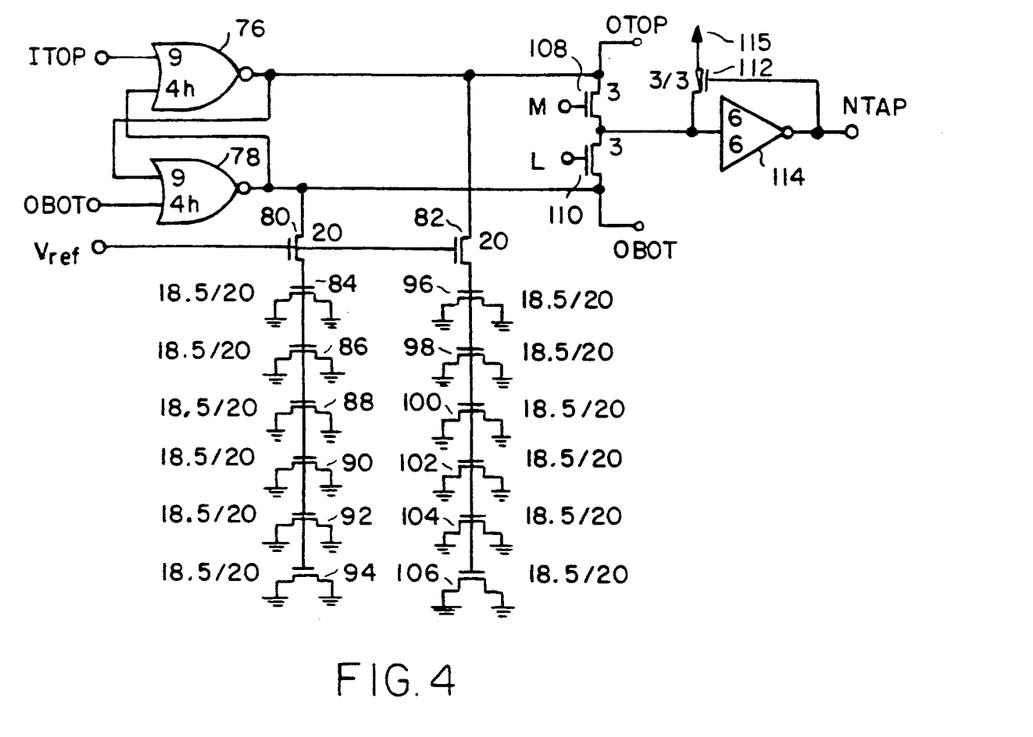
FIG. 4 is one embodiment of a delay line segment that can be utilized in the delay line of FIG. 3.
Figure 5:
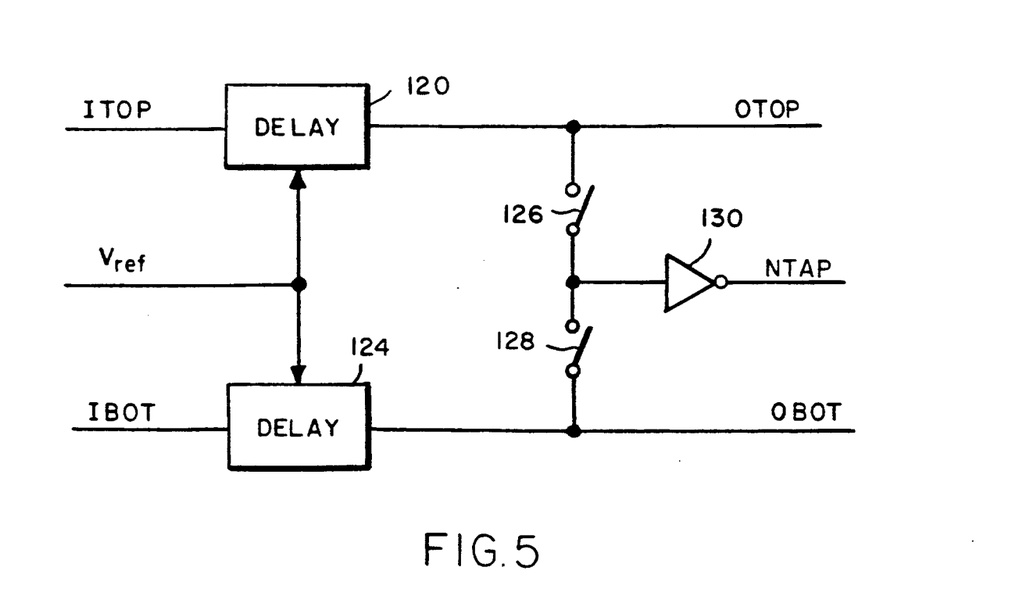
FIG. 5 shows another embodiment of a delay line segment that can be utilized in the delay line of FIG. 3.

Sixteen delay line segments are illustrated in FIG. 3 because in this embodiment it is desired to obtain four separately phased clock signals D, E, F, and G, as shown in FIG. 2. This is accomplished by obtaining output signals from certain delay line segments, or taps. In each case, the tap output is one of the top OTOP or bottom segment outputs, as selected by the state of the PHI1 and PHI2 signals. As shown in FIGS. 4 and 5, each delay line segment NTAP output produces a signal that has been inverted by inverter 114, so it is necessary to provide an additional respective inverter 52, 54, 56, 58, 60 or 62 at the NTAP output to provide an uninverted tap output signal. Tap signal A is produced by fourth segment 26 and inverter 54. Tap signal B is produced by eighth segment 34 and inverter 56. Tap signal C is produced by twelfth segment 42 and inverter 60. As shown in FIG. 2, where a clock signal CLK is provided, and it is desired to obtain four equal phases of that clock signal as output clock signals D, E, F, and G, this can be done by producing tap signals A, B, and C, each derived from the original clock input signal CLK. As shown in FIG. 1, clock output signals D, E, F, and G can be obtained by appropriately combining signals A, B, and C combinatorially. For example, this can be accomplished utlizing logic gates 64, 66, 68, and 70. Signal D is the inverse of siganl A ANDed with the inverse of signal B ANDed with the inverse of signal C. Signal E is signal A ANDed with the inverse of signal B AND the inverse of signal C. Signal F is signal A ANDed with signal B ANDed with the inverse of signal C. Signal G is signal A ANDed with signal B ANDed with signal C. Alternatively, for the tap signals A, B, and C shown in FIG. 2, signal C need not be utilized for generation of output signals D and E, while signal C alone could determine output signal G, and tap signal A need not be utilized for generation of output signal F. Additional desired outputs may require additional taps.

As shown in FIG. 1, delay line 16 generates four other signals which are supplied only to phase detector 72. These are a tap signal TAP2 from second delay segment 22, a tap signal TAP9 from ninth delay segment 36, a tap signal TAP14 from fourteenth delay segment 46, and the output signal BOTEND from sixteenth delay segment 50. Phase detector 72 examines these signals for any phase or frequency error, and generates control signals PD, CD, NPU, and NCU to control delay line 16 and adjust the phase or delay. More specifically, output signals PD, CD, NPU, and NCU are provided to charge pump 18, which in response produces voltage control signal $V_{ref}$. Voltage control signal $V_{ref}$, which is provided to each segment 20-50 of delay line 16, controls the total delay through delay line 16.

As shown in FIGS. 3 and 4, each delay line segment 20-50 has two signal inputs ITOP and IBOT (top input and bottom input, respectively), and produces two delayed output signals OTOP and OBOT (top output and bottom output, respectively). As shown in FIG. 4, the two output signals OTOP and OBOT can be produced by two crossed NOR gates 76 and 78. As shown in FIG. 4, control voltage input $V_{ref}$ is applied to FETs (Field Effect Transistors) 80 and 82, which act as variable resistors. The source of FET 80 is connected to the output of NOR gate 78, while the source of FET 82 is connected to the output of NOR gate 76. Each of FETs 84-106 has its drain and source connected together, for example to ground. The gate of each of FETs 84-94 is connected to the drain of FET 80 while the gate of each of FETs 96-106 is connected to the drain of FET 82. Accordingly, FETs 84-106 act as capacitors between ground and the drains of FETs 80 and 82, respectively. In this manner, control voltage $V_{ref}$ controls the speed of operation, and thus the delay provided by, each delay line segment 20-50. In FIG. 4, $V_{ref}$ does so by controlling the resistances provided by FETs 80 and 82. Varying the resistance of the MOSFETs 80 and 82 varies the effective amount of capacitive loading from MOSFETs 84-94 and 96-106 respectively seen by NOR gates 76 and 78, thus controlling the delay. Increasing this resistance decreases the effective capacitive loading on NOR gates 76 and 78, thereby increasing speed of operation of the NOR gates, and decreasing the delay provided by the delay line segment.

Two other inputs to each segment 20-50 are signals PHI1 and PHI2. As shown in FIG. 2, these signals are provided alternately to inputs L and M, or M and L, of each delay line segment 20-50. In FIG. 4, the signal applied to input M is applied to the gate of FET 108, while the signal applied to input L is applied to the gate of FET 110. Since signal PHI1 is high when signal PHI2 is low and vice versa, only one of FETs 108 and 110 will be switched on at any time. Signals PHI1 and PHI2 if applied in the active state to FET 108 or FET 110 would turn that FET on. If FET 108 is turned on, then segment output signal OTOP is inverted and produced at the NTAP output of the segment. If FET 110 is instead switched on, then output signal OBOT is inverted and provided to the NTAP output of the segment.

The numbers (other than reference numerals) shown by each element in the Figures indicate their size. For example, FET 80 is labeled just with the number 20, which indicates a 20 micron wide transistor with the minimum channel length of 1½ mirons and effectively of 0.85 microns. FET 84, which has two numbers, is indicated to be 18½ microns wide and 20 microns long, with a resulting effective length of 20−(1.5−0.85)=19.35. FETs drawn with an additional diagonal slash in the FET symbol, between drain and source (such as FET 112), are P-channel, while FETs drawn without that additional slash (such as FET 84) are N-channel. Gates are preferably implemented in CMOS. For example, NOR gate 76, which bears characters 9 and 4h, has a 9 micron wide P-channel transistor and a 4.5 micron wide N-channel transistor (the notation 4h meaning 4.5 or four and one-half). As another example, inverter 114, which bears characters 6 and 6, has a 6 micron wide P-channel transistor and a 6 micron wide N-channel transistor. An upwardly pointing arrow not connected at its arrowhead to another element (e.g., 115) indicates a connection to supply voltage. The particular component sizes are shown by way of example only; the invention is not to be construed as being limited thereto.

Alternatively, as shown in FIG. 5, a delay line segment can comprise any sort of voltage controlled delay 120 and 124, each controlled by an appropriate reference signal such as the common signal $V_{ref}$. Control switches 126 and 128, respectively controlled by the M and L inputs, are then used to determine which output signal OTOP or OBOT is provided to inverter 130 for the NTAP output. As one example, instead of crossed NOR gates 76 and 78, two pairs of inverters could be used, with each inverter in a pair connected in series, and each pair connected between the ITOP and OTOP, or IBOT and OBOT, ports.

The apparatus illustrated in FIG. 3 provides four-phase output signals. For an eight-phase output system, taps could be taken from each of second segment 22, fourth segment 26, sixth segment 30, eighth segment 34, tenth segment 38, twelfth segment 42, and fourteenth segment 46. Each such tap would then be provided both to logic for generating the output signals (using different logic than logic gates 64, 66, 68, and 70), and to phase detector 72 for detection of phase errors. Also, although sixteen segments are shown in FIG. 3, any number of segments could be used. For example, if four-phase output signals are desired by the user, then the number of delay line segments used could be any integral multiple of four. However, the number of segments to be used would also be determined by the maximum and minimum values for the voltage controlled delays through each delay line 16 segment 20-50. The choice of numbers of segments would be based primarily on the number of output phases desired by the user, and the limits of the individual delay elements or segments.

Figure 6:
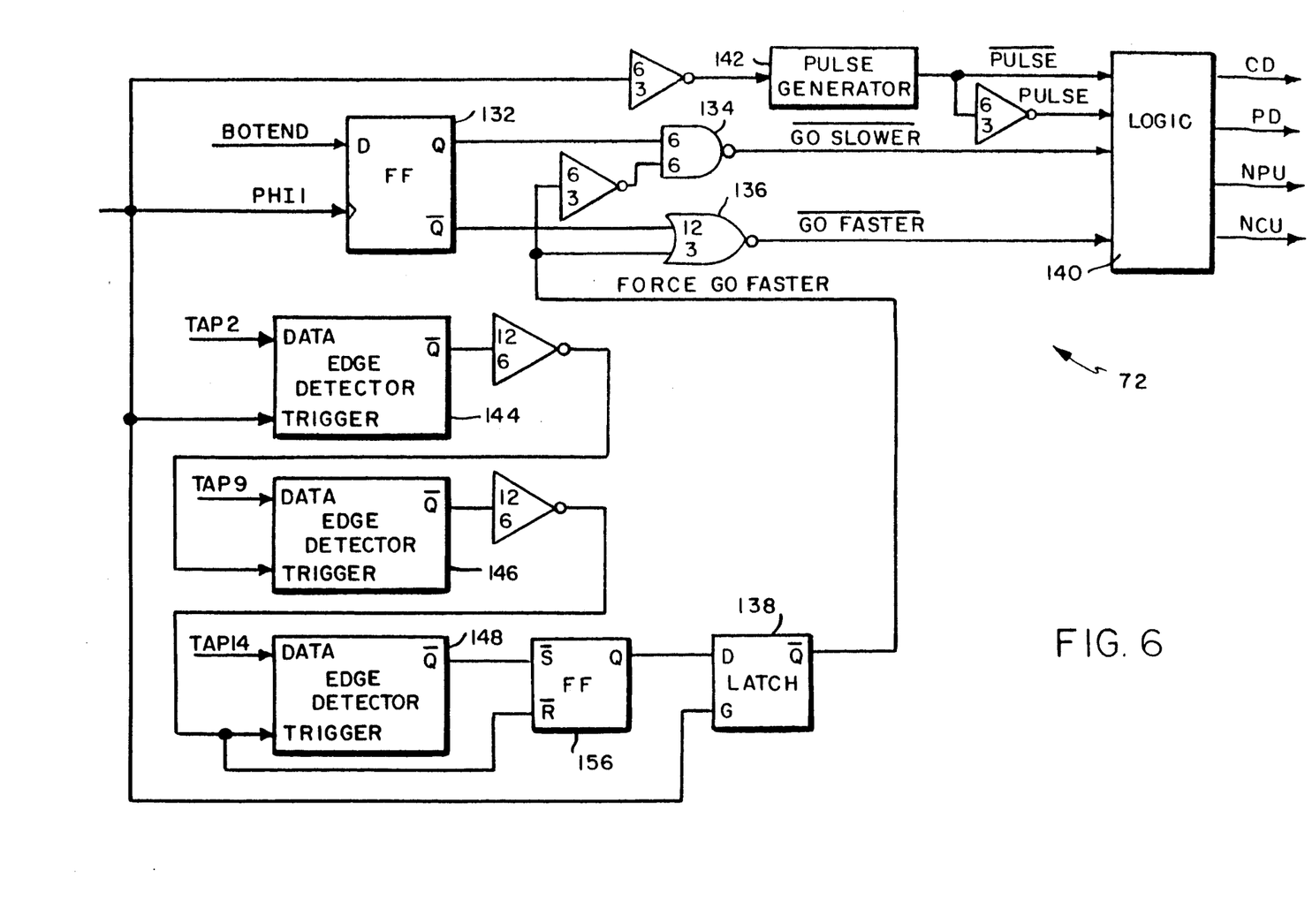
FIG. 6 shows a phase detector according to the present invention that can be utilized in the apparatus of FIG. 1.

Further detail on phase detector 72 is shown in FIG. 6. Segment 50 output BOTEND and divider output PHI1 are respectively provided to the data and trigger inputs of edge-triggered D-type flip-flop 132. A true signal from the Q output of flip-flop 132, plus a false state for the FORCE GO FASTER signal from latch 138, causes a false-state output from NAND gate 134. The inverted GO SLOWER signal produced by NAND gate 134 is then held true or low. The not-Q output of flip-flop 132 is provided to one input of NOR gate 136. A logic true signal from the not-Q output of flip-flop 132, and/or on the FORCE GO FASTER signal from latch 138, causes a false-state output from NOR gate 136. The inverted GO FASTER signal produced by NOR gate 136 is then held true or low. Accordingly, if a rising edge of divided clock signal PHI1 triggers flip-flop 132 while segment 50 output signal BOTEND is high, then the inverted GO SLOWER signal will be active unless overridden by the FORCE GO FASTER signal from latch 138. Otherwise, the inverted GO FASTER signal will be active. Both the GO SLOWER signal and the GO FASTER signal are provided as inputs to logic 140. Also, an inverted PHI1 signal is provided to pulse generator 142. Pulse generator 142, in response to signal PHI1 becoming low, generates a single negative true output pulse. Pulse generator 142, upon receiving a rising edge, generates a pulse by NANDing the received signal with its delayed inverse. Pulse width is equal to that delay. However, any sort of pulse generator could be utilized as pulse generator 142. That pulse and its inverse are also provided to logic 140. Logic 140 generates appropriate levels for control signals CD, PD, NPU, and NCU, which are then provided to control charge pump 18. In response to on the state of signals CD, PD, NPU, and NCU, charge pump 18 will pump up, pump down, charge up or charge down.

Figure 7:
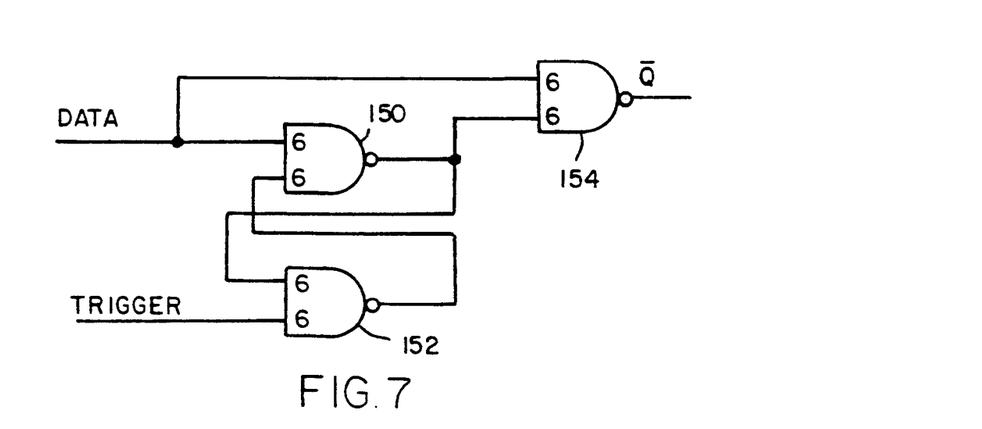
FIG. 7 shows an edge detector that can be utilized in the phase detector of FIG. 6.

As discussed above, the GO SLOWER signal and the GO FASTER signal state can be controlled, and the output of flip-flop 132 overridden, by inverting transparent latch 138, which generates the FORCE GO FASTER signal. Generation of that signal will now be described. Phase detector 72 includes rising edge detectors 144, 146, and 148. Each such edge detector 144, 146, and 148 produces a low or true output signal upon detecting a rising edge on a certain signal, unless its trigger input is held low (false). Once such edge detector is shown in FIG. 7. As shown in FIG. 7, two NAND gates 150 and 152 are cross-coupled to in effect form a not-S, not-R single Q output flip-flop. The input signal on which a rising edge is to be detected is applied to one input of NAND gate 150 and to one input of NAND gate 154. A similar arrangement can be utilized as flip-flop 156 of FIG. 6. However, if the trigger signal applied to one input of NAND gate 152 is held low, then no edge of the input signal could be detected by the edge detector of FIG. 7. Alternatively, other edge detectors could be utilized as edge detectors 144, 146, and 148.

Edge detectors 144, 146, and 148 together determine whether a series of rising edges appear in a certain predetermined desired order, as a check on proper operation of segmented delay line 16. For the arrangement of FIG. 6, taps are obtained from three delay line 16 segments, and are checked for proper sequencing of rising edges within delay line 16. As shown in FIG. 3, signal TAP2 is obtained by inverting 52 the NTAP output of second segment 22. Signal TAP9 is obtained by inverting 58 the NTAP output of ninth segment 36. Signal TAP14 is obtained by inverting 62 the NTAP output of fourteenth segment 46. Signal TAP2 is provided as the input signal, and signal PHI1 is provided as the trigger signal, to edge detector 144. Signal TAP9 is provided as the input signal, and an inversion of the output of edge detector 144 is provided as the trigger signal, to edge detector 146. Signal TAP14 is provided as the input signal, and an inversion of the output of edge detector 146 is provided as the trigger signal, to edge detector 148. Accordingly, edge detector 146 will not indicate presence of any rising edge on its input signal TAP9 unless edge detector 144 first detects a rising edge on its input signal TAP2. Similarly, edge detector 148 will not detect any rising edge on its input signal TAP14 unless edge detector 146 first detects a rising edge on its input signal TAP9.

Divided clock signal PHI1 IS applied to the G or clock input of transparent latch 138. While signal PHI1 is active (high), the output of latch 138 changes to pass data received. In that condition, the output not-Q of latch 138 is then equal to its data input D. While signal PHI1 is inactive (low), latch 138 holds its previous value, and its output not-Q is unchanged (not-Q=not-Q) notwithstanding whatever may appear at its data input D. This is what is meant by latch 138 being "transparent". The output not-Q of latch 138 is updated to reflect its present data input D only while its clock input G is active or high. Edge detector 144 is triggered by signal PHI1 becoming active. Signal PHI1 becoming inactive closes latch 138. Thus, the output from edge detectors 144, 146 and 148 would not affect the output of latch 138 unless signal PHI1 remains active.

Accordingly, if rising edges are successively detected on signals TAP2, TAP9, and TAP14, in that order, while signal PHI1 remains true or high, then signal FORCE GO FASTER will not be held active. Failure to detect any of these edges, in the above order, indicates presence of a phase error of some odd integral multiple of 360°. To indicate and correct such error condition, signal FORCE GO FASTER is held active or true.

In FIG. 6, edges are detected on taps from second segment 22, ninth segment 36, and fourteenth segment 46. In lieu thereof, taps from any three delay line 16 segments could be utilized, with those taps being checked by corresponding edge detectors of phase detector 72 for rising edges in the order in which their corresponding segments appear in the delay line. However, first segment 20 and last segment 50 cannot be used for this purpose. This is because signal PHI1 is used to trigger first edge detector 144, so that an edge of signal PHI1 could be substantially simultaneous with an edge of a tap from either of these segments. Also, only two taps, and two edge detectors, instead of three could be effectively used for this purpose. Still, use of three (or more) taps and three (or more) edge detectors is preferred. For example, a tap could be obtained from each of fourth segment 26 and fourteenth segment 46. A computer simulation for this arrangement found that errors could be detected up to nine times 360°, but not eleven times and beyond. Also, a computer simulation involving taps from the fourth and eighth segments of a 16-segment delay line found that phase errors could be detected through nine times 360°, but not eleven times or beyond. Computer simulations of taps from the following pairs of segments of a 16-segment delay line were found to not provide detection of errors beyond ten times 360° phase error; 3 and 11, 2 and 13, 2 and 3, 2 and 5, and 2 and 14.

Figure 8:
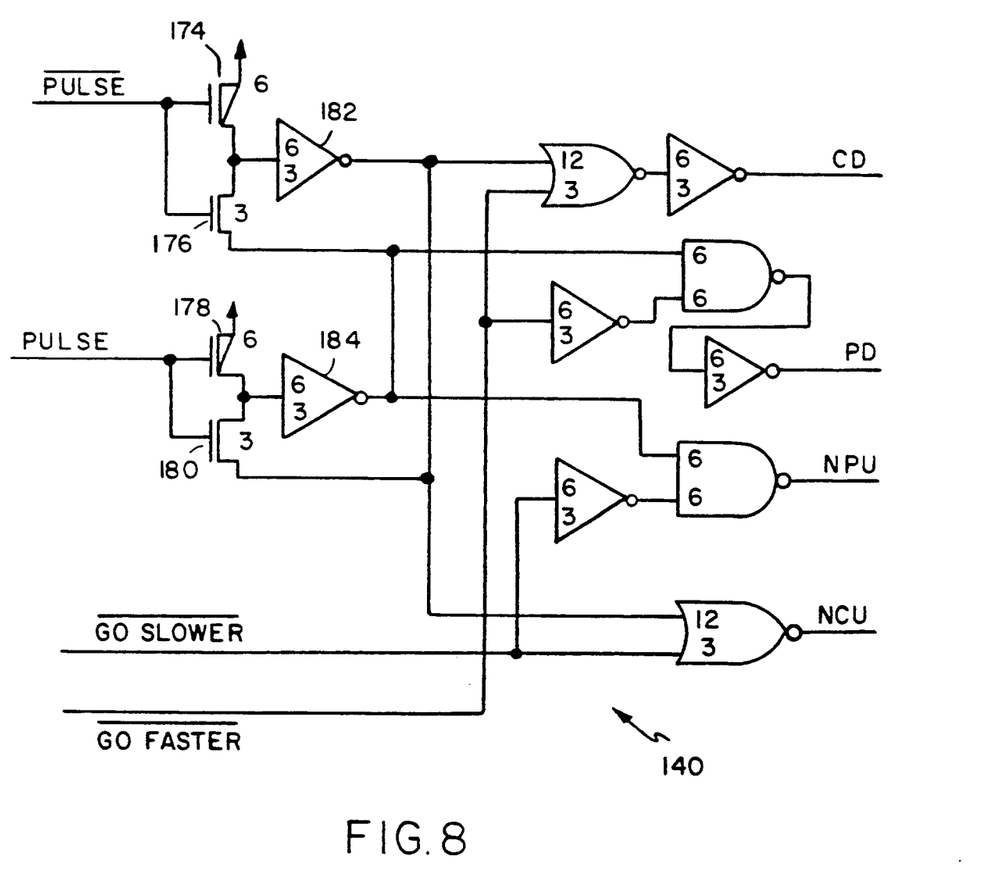
FIG. 8 shows logic for charge pump input signal generation that can be utilized in the phase detector of FIG. 6.

Logic 140 conditions the received pulse, GO SLOWER, and GO FASTER signals to produce control signals CD, PD, NPU, and NCU, such as to avoid overlapping generations, to work with charge pump 18. Logic 140 is shown in greater detail in FIG. 8. Transistors 174, 176, 178 and 180, and inverters 182 and 184, ensure that the inverted and noninverted PULSE signals are nonoverlapping. Thus, charge pump 18 does not charge (to null parasitic capacitance) while pumping (to change control signal $V_{ref}$).

Figure 9:
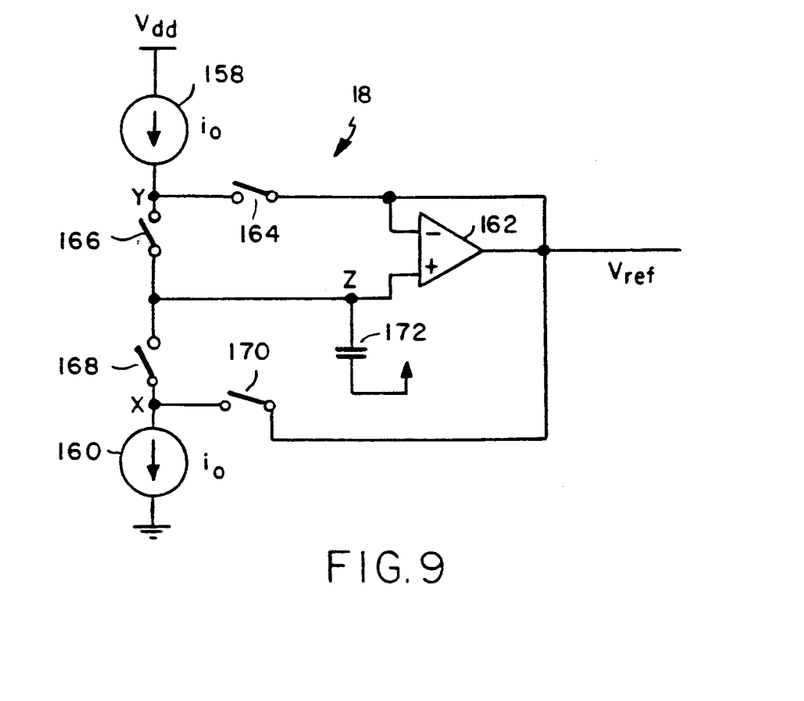
FIG. 9 is a generic block diagram illustration of a delay line charge pump and unity gain buffer that can be utilized in the apparatus of FIG. 1.
Figure 10:
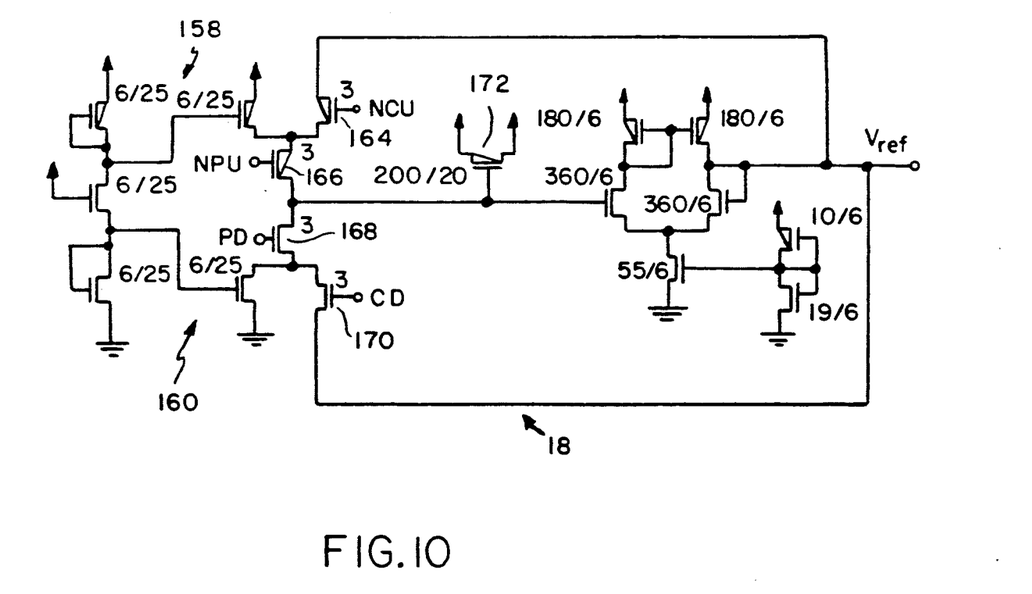
FIG. 10 shows one embodiment of the charge pump and buffer of FIG. 9.
Figure 11:
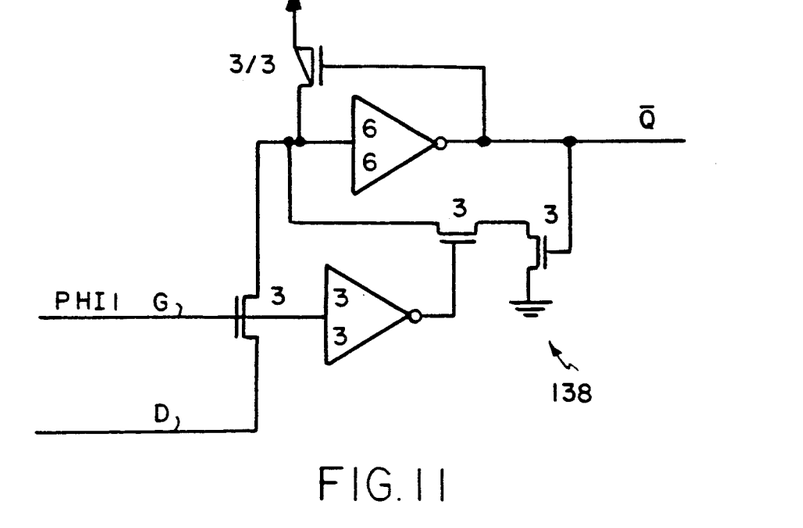
FIG. 11 shows one embodiment of the transparent latch of FIG. 6.

Charge pump 18 is shown in greater detail in FIG. 9. As shown in FIG. 9, charge pump 18 includes matched current sources 158 and 160, operational amplifier 162, and four controlled switches 164, 166, 168, and 170. Amplifier 162 is a simple operational amplifier connected in a unity gain configuration, as shown in FIG. 9. Each current source 158 and 160 produces a current $i_o$. Capacitor 172 can be connected between node Z, and supply voltage (as shown in FIGs. 9 and 10) or ground. When negative logic signal NCU is low or active, switch 164 is closed, and any parasitic capacitances in source 158, or elsewhere at node Y, charge to $V_{ref}$. When negative logic signal NPU is low or active, switch 166 is closed, and charge pump 18 pumps up. This means that the voltage drop across capacitor 172, and control voltage $V_{ref}$, are increased. When signal PD is high or active, charge pump 18 pumps down. The voltage across capacitor 172, and thus control voltage $V_{ref}$, are decreased. When signal CD is high or active, switch 170 is closed, charging to $V_{ref}$ any parasitic capacitances in source 160 and elsewhere at node X.

Signals NCU and CD are nonoverlapping complementary signals utilized to null out any parasitic effects in charge pump 18, particularly to discharge and effectively cancel parasitic capacitance of sources 158 and 160, especially when charge pump 18 is not pumping or changing control voltage $V_{ref}$. Otherwise, stored charge in such parasitic capacitance could charge capacitor 172, causing an erroneous change in control voltage $V_{ref}$. Johnson and Hudson, supra, at Section VI. at pages 1221-1222 and FIG. 8, discusses the potential for error provided by parasitic capacitance of his current source, to which reference is hereby made. In addition, switches 166 and 168, when respectively implemented as MOS transistors, have parasitic capacitive coupling effects which are also nulled out by precharging nodes X and Y to $V_{ref}$. This precharging is accomplishing by closing switches 164 and 170.

One implementation of charge pump 18 is shown in FIG. 10.

Control voltage $V_{ref}$ is produced by charge pump 18 to control speed of delay line 16.

Figure 12:
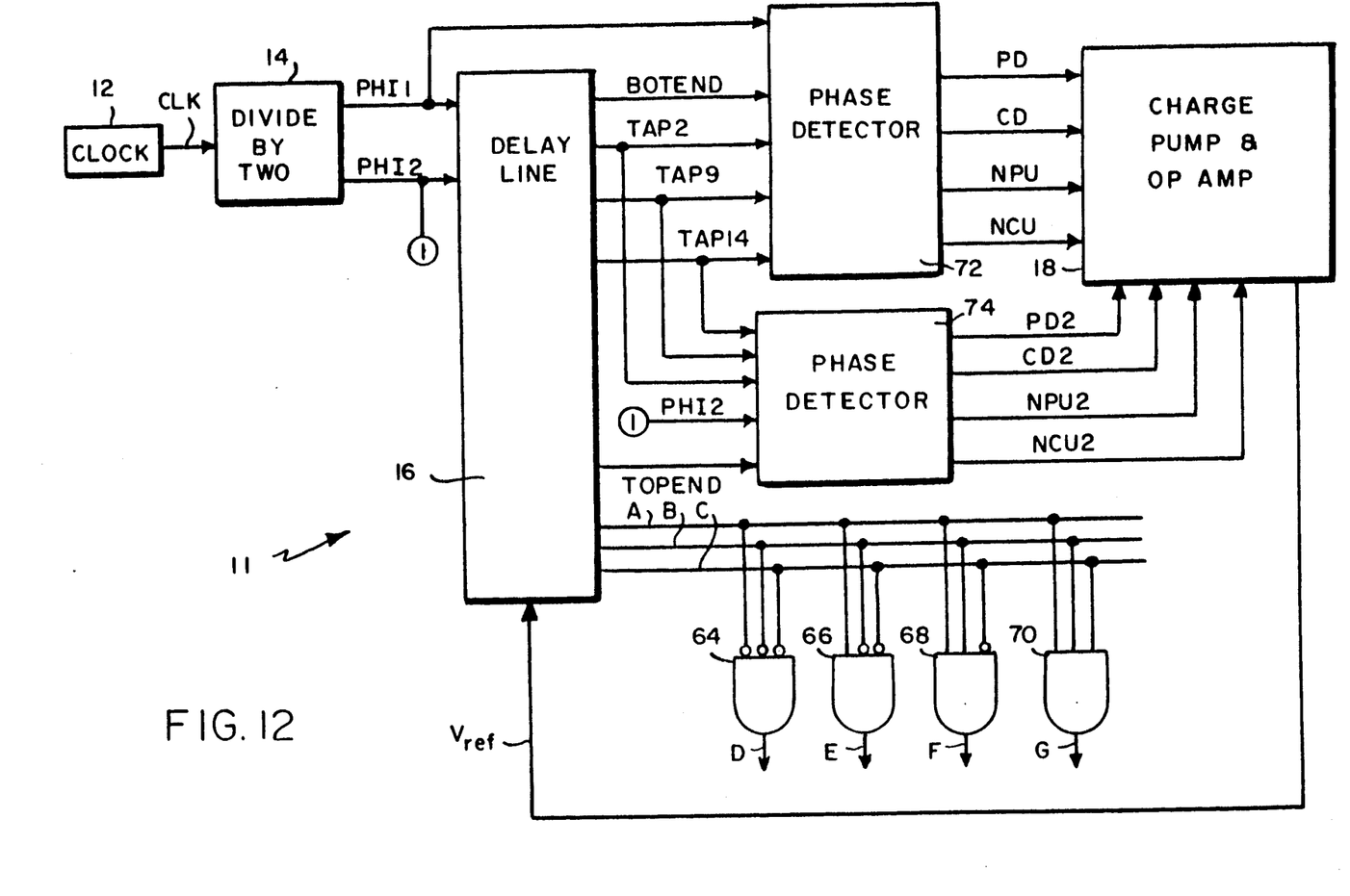
FIG. 12 is a block diagram of an alternative embodiment of a feedback controlled synchronous delay line according to the present invention.
Figure 13:
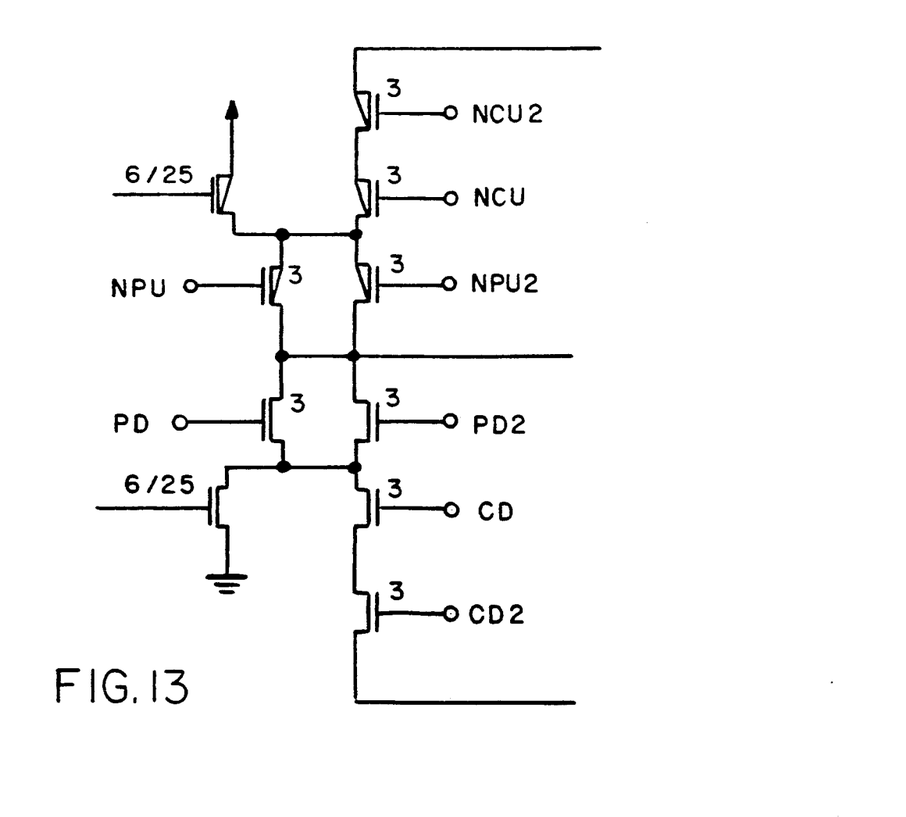
FIG. 13 shows a portion of an alternative embodiment of the charge pump, for inclusion in the apparatus of FIG. 12.

Edge detectors 144, 146, and 148 are particularly intended to address output signal phase errors of odd integral multiples of the period of the original clock signal CLK. Even (as opposed to odd) integral multiples of the period of the clock signal CLK need not be considered by these edge detectors, for the following reason. Divider 14 produces two divided clock signals, PHI1 and PHI2. Both signals PHI1 and PHI2 are received by delay line 16. However, only one of these signals, PHI1, is received by phase detector 72. Accordingly, in effect, only half of delay line 16 (the half utilizing signal PHI1) is actually utilized to produce the various taps used for error detection. However, since phase detector 72 does not receive signal PHI2, phase and frequency error correction can be done every PHI1 cycle, or only about half the time (every other CLK cycle) that phase detector 72 is operating. To avoid this delay, and thus provide faster correction of phase and frequency errors, an additional phase detector 74 can be utilized. An alternative embodiment 11 of a synchronous delay line according to the present invention, including additional phase detector 74, is shown in FIG. 12. This additional phase detector 74, is shown in FIG. 12. This additional phase detector 74 would be identical to the phase detector shown in FIGS. 6-8 and 11, except that, as shown in FIG. 12, instead of receiving divided clock signal PHI1, signal PHI2 would be received. Also, instead of receiving output signal BOTEND from the OBOT output of sixteenth delay segment 50, output signal TOPEND from the OTOP output of segment 50 would be received instead by the additional phase detector 74. In addition, as shown in FIG. 13, charge pump 18 would have to be modified to accommodate the additional control signals NCU2, NPU2, PD2, and CD2 produced by the additional phase detector. For each such additional signal, and additional transistor would be added to the charge pump configuration of FIG. 10 to accommodate each such additional signal. The additional transistor receiving NPU2 would be connected in parallel with the existing transistor receiving signal NPU. The additional transistor receiving signal PD2 would also be connected in parallel with the transistor receiving signal PD. The additional transistor receiving signal NCU2 would be connected in series with the transistor receiving signal NCU. The additional transistor receiving signal CD2 would be connected in series with the transistor receiving signal CD. Otherwise, operation of the additional phase detector 74 would be indentical to the operation of phase detector 72 described above.

It should be understood that, although FETs are preferred, the present invention can be constructed in similar fashion with similar operation with devices other than those illustrated. For example, the transistors illustrated in the drawings can be N-channel FETs, P-channel FETs, CMOS, or bipolar transistors. The invention can be implemented in CMOS, NMOS, PMOS, bipolar or GaAs. All topologies shown in the drawings are equally valid for alternative transistors. Additionally, the illustrated topologies are useful for a wide range of possible device geometries, e.g., lengths and widths of diffusion regions.

Some of the many advantages of the invention should now be readily apparent. For example, a novel phase detector has been provided which capable of detecting phase errors, in a periodic signal such as a clock signal, of integral multiples of 360°, as well as phase errors less than 360°, when compared with another periodic signal such as another clock signal from which the first is derived. Also, a novel apparatus has been provided for generating a plurality of differently phased periodic signals that are corrected to have predetermined desired phase relationship, particularly such that phase errors between such signals, of integral multiples of 360°, can be detected and corrected. In addition, a novel apparatus has been provided that can be used to generate multiple internal clock phases or sub-phases from a single input clock, all of which are synchronized together, wherein the generated clock signals are corrected for phase errors, particularly phase errors of integral multiples of 360°. As a result, reliability and accuracy in the generation of such phases or sub-phases is improved.

Obviously, many modifications and variations of the present invention are possible in light of the above teachings. It is therefore to be understood that the foregoing embodiments are presented by way of example only and that, within the scope of the appended claims and equivalents thereto, the invention may be practiced otherwise than as specifically described.

What is claimed is:

1. Apparatus for detection of phase errors in a periodic signal, comprising:

a plurality of edge detector means, each of said edge detector means being connected to receive a signal having a respective delay of the periodic signal, for detecting whether an edge of the respective delayed signal is present, wherein one of said edge detector means is triggered to perform edge detection by the periodic signal, and each remaining edge detector means is triggered by the output of another respective edge detector means, said plurality of edge detector means being thereby connected one to another in series; and first latching means, triggered by the periodic signal and operatively connected to an output of the last-connected of said plurality of edge detector means, for producing an output signal indicative of the current output of said last-connected of said plurality of edge detector means while said first latching means is triggered by the periodic signal, the output signal being indicative, while said first latching means is not triggered by the periodic signal, of the output of said last-connected of said edge detector means while the periodic signal was last triggering said first latching means, whereby the output signal produced by said first latching means is indicative of a phase error unless edges are detected in the respective differently delayed versions of the periodic signal by said plurality of edge detector means in sequence while the periodic signal triggers both said edge detector means and said first latching means.

2. Apparatus as recited in claim 1 wherein said first latching means comprises a transparent latch.

3. A synchronous delay line, comprising:

a multiple segment delay line comprising a plurality of delay components connected in cascade, each of said delay components producing a respective delay signal, wherein said multiple segment delay line receives a periodic signal for delay thereof and wherein the delay provided by each of said delay components is determined by a first control signal;

a first phase detector, receiving the periodic signal and a first plurality of the delay signals for determining whether there is any phase error between the produced delayed signals and the periodic signal, and producing at least one second control signal indicative thereof;

control signal generating means, responsive to the at least one second control signal, for producing the first control signal; and first signal processing means, responsive to a second plurality of the delay signal, for producing at least one output signal that is sub-phase of the periodic signal.

4. A synchronous delay line as recited in claim 3 wherein:

said multiple segment delay line also receives an inverse periodic signal which is the inverse of the periodic signal;

said synchronous delay line further comprises a second phase detector, responsive to the inverse periodic signal and the plurality of signals each produced by a different delay component, for determining whether there is any phase error between the produced delayed signals and the inverse periodic signal, and producing at least one third control signal indicative thereof; and said control signal generating means is further responsive to the at least one third control signal, for producing the first control signal.

5. A synchronous delay line as recited in claim 3 wherein said first phase detector comprises:

a plurality of edge detector means, each of said edge detector means being connected to receive a signal having a respective delay of the periodic signal, for detecting whether an edge of the respective delayed signal is present, wherein one of said edge detector means is triggered to perform edge detection by the periodic signal, and each remaining edge detector means is triggered by the output of another respective edge detector means, said plurality of edge detector means being thereby connected one to another in series; and first latching means, triggered by the periodic signal and operatively connected to an output of the last-connected of said plurality of edge detector means, for producing an output signal indicative of the current said last-connected of said plurality of edge detector means while said first latching means is triggered by the periodic signal, the output signal being indicative, while said first latching means is not triggered by the periodic signal, of the output of said last-connected of said edge detector means while the periodic signal was last triggering said first latching means, whereby the output signal produced by said first latching means is indicative of a phase error unless edges are detected in the respective differently delayed versions of the periodic signal by said plurality of edge detector means in sequence while the periodic signal triggers both said edge detector means and said first latching means.

6. A synchronous delay line as recited in claim 5 wherein said first latching means comprises a transparent latch.

7. Apparatus as recited in claim 1 wherein said plurality of edge detector means comprises at least three edge detector means.

8. Apparatus as recited in claim 7 wherein said first latching means comprises a transparent latch.

9. A synchronous delay line as recited in claim 5 wherein said plurality of edge detector means comprises at least three edge detector means.

10. A synchronous delay line as recited in claim 9 wherein said first latching means comprises a transparent latch.

11. A synchronous delay line as recited in claim 4 wherein said first phase detector comprises:

a first plurality of edge detector means, each of said first plurality of edge detector means being connected to receive a signal having a respective delay of the periodic signal, for detecting whether an edge of the respective delayed signal is present, wherein one of said first plurality of edge detector means is triggered to perform edge detection by the periodic signal, and each remaining edge detector means of said first plurality is triggered by the output of another respective edge detector means of said first plurality, said first plurality of edge detector means being thereby connected one to another in series; and first latching means, triggered by the periodic signal and operatively connected to an output of the last-connected of said first plurality of edge detector means, for producing an output signal indicative of the current output of said last connected of said first plurality of edge detector means while said first latching means is triggered by the periodic signal, the output signal being indicative, while said first latching means is not triggered by the periodic signal, of the output of said last-connected of said first plurality of edge detector means while the periodic signal was last triggering said first latching means, whereby the output signal produced by said first latching means is indicative of a phase error unless edges are detected in the respective differently delayed versions of the periodic signal by said first plurality of edge detector means in sequence while the periodic signal triggers both said first plurality of edge detector means and said first latching means.

12. A synchronous delay line as recited in claim 11 wherein said second phase detector comprises:

a second plurality of edge detector means, each of said second plurality of edge detector means being connected to receive a signal having a respective delay of the inverse periodic signal, for detecting whether an edge of the respective delayed signal is present, wherein one of said second plurality of edge detector means is triggered to perform edge detection by the inverse periodic signal, and each remaining edge detector means of said second plurality is triggered by the output of another respective edge detector means of said second plurality, said second plurality of edge detector means being thereby connected one to another in series; and second latching means, triggered by the inverse periodic signal and operatively connected to an output of the last-connected of said second plurality of edge detector means, for producing an output signal indicative of the current output of said last-connected of said second plurality of edge detector means while said second latching means is triggered by the inverse periodic signal, the output signal being indicative, while said second latching means is not triggered by the inverse periodic signal, of the output of said last-connected of said second plurality of edge detector means while the inverse periodic signal was last triggering said second latching means, whereby the output signal produced by said second latching means is indicative of a phase error unless edges are detected in the respective differently delayed versions of the inverse periodic signals by said second plurality of edge detector means in sequence while the inverse periodic signal triggers both said second plurality of edge detector means and said second latching means.

13. A synchronous delay line as recited in claim 12 wherein:

said first plurality of edge detector means comprises at least three edge detector means; and said second plurality of edge detector means comprises at least another three edge detector means.

14. A synchronous delay line as recited in claim 13 wherein:

said first latching means comprises a first transparent latch; and said second latching means comprises a second transparent latch.

* * * * *

UNITED STATES PATENT AND TRADEMARK OFFICE
CERTIFICATE OF CORRECTION

PATENT NO. :  5,120,990
DATED      :  June 2, 1992
INVENTOR(S) : Gregory T. Koker It is certified that error appears in the above—identified patent and that said Letters Patent is hereby corrected as shown below:

Col. 10

Claim 1, line 19, replace "current" with --present--.
Col. 11
Claim 5, line 22, replace "current" with --present output of--.
Col. 12
Claim 11, line 2, replace "current" with --present-- and replace "last" with --last- --.
Col. 12
Claim 12, line 38, replace "current" with --present--.

Signed and Sealed this

Tenth Day of August, 1993

Attest:

MICHAEL K. KIRK

*Attesting Officer*  Acting Commissioner of Patents and Trademarks